US007199778B2

(12) United States Patent
Chi et al.

(10) Patent No.: US 7,199,778 B2
(45) Date of Patent: Apr. 3, 2007

(54) ACTIVE MATRIX DISPLAY AND SWITCHING SIGNAL GENERATOR OF SAME

(75) Inventors: Ching-Ching Chi, Hsinchu (TW); Hsiao-Yi Lin, Hsinchu (TW)

(73) Assignee: TPO Displays Corp., Miao-Li County (TW)

( * ) Notice: Subject to any disclaimer, the term of this patent is extended or adjusted under 35 U.S.C. 154(b) by 308 days.

(21) Appl. No.: 10/372,866

(22) Filed: Feb. 24, 2003

(65) Prior Publication Data

US 2004/0070561 A1 Apr. 15, 2004

(30) Foreign Application Priority Data

Oct. 9, 2002 (TW) .............................. 91123360 A

(51) Int. Cl.
*G09G 3/36* (2006.01)
*H03L 7/00* (2006.01)

(52) U.S. Cl. ......................... 345/98; 345/90; 345/208; 327/161; 327/163

(58) Field of Classification Search .................. 345/55, 345/56, 87, 204, 208, 211–214, 92–94, 98–100; 327/161, 163, 165, 172, 175, 269, 291
See application file for complete search history.

(56) References Cited

U.S. PATENT DOCUMENTS 5,250,931 A 10/1993 Misawa et al.
5,767,832 A 6/1998 Koyama et al.
5,854,615 A 12/1998 Hush
5,929,464 A 7/1999 Yamazaki et al.
6,211,849 B1 * 4/2001 Sasaki et al. ................. 345/55
6,232,939 B1 * 5/2001 Saito et al. ................... 345/93
6,310,600 B1 10/2001 Koyama et al.
6,337,677 B1 * 1/2002 Higashi ...................... 345/100
6,426,743 B1 * 7/2002 Yeo et al. .................. 345/213
6,614,418 B2 9/2003 Koyama et al.
6,670,943 B1 * 12/2003 Ishii et al. .................. 345/100
6,831,622 B2 * 12/2004 Aoki .......................... 345/87
6,963,327 B2 * 11/2005 Kawahata et al. .......... 345/100

FOREIGN PATENT DOCUMENTS

JP 8084310 3/1996

* cited by examiner

*Primary Examiner*—Henry N. Tran

(57) ABSTRACT

A switching signal generator of an active matrix display is disclosed. The switching signal generator includes at least one delay device connected to the switches of the active matrix display. The delay device consists of many delay units connected in series for receiving a source switching signal and correspondingly generating a plurality of target switching signals controlling the switches. There is a constant phase shift between any two successive target switching signals so that the switches are switched on one by one at regular intervals.

15 Claims, 6 Drawing Sheets

ACTIVE MATRIX DISPLAY AND SWITCHING SIGNAL GENERATOR OF SAME

FIELD OF THE INVENTION

The present invention relates to a switching signal generator, and more particularly to a switching signal generator applied in an active matrix display. The present invention also relates to an active matrix display comprising a switching signal generator.

BACKGROUND OF THE INVENTION

The great progress has been made in designing and manufacturing computer equipment. The higher speed and better performance of various kinds of processors increase our dependence on computers. Moreover, computer-related skills are essential to students or workers. A monitor is the direct communication medium between a user and a computer. All the information that the user needs from the computer are displayed on the monitor. Hence, not only the speed and the performance of the computer, but also the quality of the monitor should be paid attention to.

In the past, increasing the screen size of the cathode ray tube (CRT) monitor indicates that large volume of the monitor is inevitable. It troubles the user for placing the monitor. Moreover, the radiation of the conventional monitor is harmful to human body. A liquid crystal display (LCD) is developed to solve these problems.

Please refer to FIG. 1(*a*) showing the structure of a prior art liquid crystal display. The liquid crystal display mainly includes a thin film transistor (TFT) array 100 and a driving circuit. The driving circuit includes a data shift register 105, a scan shift register 110, data switches C1~Cn, N-bit digital-to-analog converters (DACs) D1~Dn.

The thin film transistor array 100, consisting of a plurality of display cells E11~Emn arranged in columns and rows, is the display region of the liquid crystal display. FIG. 1(*b*) shows one of the display cells. Each display cell includes a capacitor structure 1001 and a thin film transistor 1002. The capacitor structure 1001 is used for storing analog video signals. The thin film transistor array 100 includes plural rows of scan lines and plural columns of data lines. A scan line controls the ON/OFF state of all the thin film transistors 1002 of the display cells in the designated row. Then the data lines transmit analog video signals to the capacitor structures 1001 of the display cells whose thin film transistors 1002 are in an ON state.

The scan shift register 110 consists of a plurality of register units A1~Am interconnected in series. Each register unit A1~Am is associated with one of the scan lines. The scan shift register 110 sequentially enables the scan lines to control the ON state of the thin film transistors 1002 row by row.

The data shift register 105 also consists of a plurality of register units B1~Bn interconnected in series. Each register unit B1~Bn is associated with one of the data switches C1~Cn. The data shift register 105 can sequentially switch on data switches C1~Cn. Each data switch C1~Cn includes N thin film transistors (only one thin film transistor is shown in FIG. 1(*a*) for simplicity). Switching on a data switch means digital video signals in the N-bit data line (Din) pass through this data switch simultaneously.

The N-bit digital-to-analog converters D1~Dn are correspondingly coupled to the data switches C1~Cn. Each N-bit digital-to-analog converter D1~Dn receives the digital video signals from the N-bit data line (Din) and converts them into analog video signals when the corresponding data switch C1~Cn is switched on. Then, the analog video signals are inputted to the corresponding data line of the thin film transistor array 100.

Please refer back to FIG. 1(*a*). At first, the data switch C1, controlled by the register unit B1 of the data shift register 105, is switched on when a first group of digital video signals are inputted from N-bit data line (Din). Hence, the first group of digital video signals can pass through the data switch C1, and then are converted into the first group of analog video signals by the N-bit digital-to-analog converter D1. Afterwards, the first group of analog video signals get into the data line connecting the display cells E11~Em1. At the same time, the register unit A1 of the scan shift register 110 enables the scan line connecting the display cells E11~E1*n* to switch on the thin film transistors in the display cells E11~E1*n*. Hence, the first group analog video signals are stored in the display cell E11.

Next, the data switch C2 is switched on by the register unit B2 of the data shift register 105 when a second group of digital video signals are inputted from N-bit data line (Din). Hence, the second group of digital video signals can pass through the data switch C2, and then are converted into the second group of analog video signals by the N-bit digital-to-analog converter D2. That it, the second group of analog video signals will get into the data line connecting the display cells E12~Em2. Meanwhile, it is still the scan line connecting the display cells E11~E1*n* being driven. Hence, the second group analog video signals are stored in the display cell E12 corresponding to the first row scan line and the second column data line.

The data shift register 105 then sequentially switches on all the following data switches C3~Cn, and the display cells E13~E1*n* in the first row store corresponding groups of analog video signals. After all the display cells E11~E1*n* in the first row have stored respective analog video signals, the register unit A2 of the scan shift register 110 is enabled to drive the scan line connecting the display cells E21~E2*n*. The analog video signals are stored into the display cells E21~E2*n* of the thin film transistor array 100 by means as described above. After the scan shift register 110 enables all the scan lines in turn, all the display cells E11~Emn of the thin film transistor array 100 have stored analog video signals. Hence, the liquid crystal display shows a full image page on screen.

The analog video signals in every display cell E11~Emn of the thin film transistor array 100 are refreshed frequently, and that is, the liquid crystal display refreshes images very quickly. What the user see on screen are dynamic images. Certainly, a static image is shown when the analog video signals are refreshed with the same data. Flickers may occur on the liquid crystal display if the refresh rate is too slow.

Please refer to FIG. 1(*c*) which is a circuit diagram of the data shift register 105/scan shift register 110. The prior art shift register 105 or 110 includes a plurality of flip-flops 120 serving as the register units of FIG. 1(*a*). The flip-flops 120 are operated in response to a clock signal (CLK) and a start pulse signal (ST) generated by the driving circuit of the liquid crystal display. The flip-flops 120 are controlled by the clock signal (CLK), and then sequentially converts the start pulse signal into enable signals to enable corresponding data switches C1~Cn or the scan lines. In other words, the driving circuit must generate two clock signals (CLK): one for data shift register 105 and the other one for scan shift register 110. The clock signals (CLK) must be connected to each flip-flop of the shift registers 105 and 110, and thus a great number of pins are required. It is apparent that this requirement complicates the designing and manufacturing of the shift registers 105 and 110. The efforts have been made to develop a better design to solve such problems.

SUMMARY OF THE INVENTION

An object of the present invention is to provide a switching signal generator for use in the driving circuit of an active matrix display, which simplifies the circuitry of the active matrix display.

Another object of the present invention is to provide an active matrix display having simplified circuit structure.

A first aspect of the present invention relates to a switching signal generator for use with a plurality of switches of an active matrix display. The switching signal generator comprises a plurality of delay units electrically connected to the plurality of switches, and generating a plurality of target switching signals in response to a source switching signal for controlling signals to be outputted to an active matrix portion of the active matrix display via the plurality of switches. There is a constant phase shift between every two successive target switching signals, thereby switching on the plurality of switches and outputting the signals to the active matrix portion in sequence.

In an embodiment, the active matrix portion includes a thin film transistor (TFT) array interconnected by a plurality of scan lines and data lines.

Preferably, the first one of the delay units receives the source switching signal, and each of the following delay units receives one of the target switching signals outputted from a preceding one of the delay units.

In an embodiment, the switching signal generator includes a first generator portion generating a first portion of the plurality of target switching signals in response to the source switching signal for controlling signals to be sequentially outputted to data lines of the active matrix display via a first portion of the plurality of switches, and a second generator portion generating a second portion of the plurality of target switching signals in response to the source switching signal for controlling signals to be sequentially outputted to scan lines of the active matrix display via a second portion of the plurality of switches If the signals outputted via the first portion of the plurality of switches are digital video signals, they are preferably converted into analog video signals by a plurality of digital-to-analog converters of the active matrix display before being outputted to the data lines.

A second aspect of the present invention relates to a switching signal generator for use in an active matrix display. The switching signal generator comprises a first generator portion receiving a source switching signal and generating a set of first target switching signals, and a second generator portion receiving the source switching signal and generating a set of second target switching signals. There is a first phase shift between every two of the first target switching signals and there is a second phase difference between every two of the second target switching signals for switching on active matrix units of the active matrix display in sequence.

For example, the active matrix units of the active matrix display comprise a thin film transistor array interconnected by scan lines and data lines.

Preferably, the first generator portion comprises a plurality of delay units, the first one of the delay units receives and delays the source switching signal, and each of the following delay units receives and delays one of the target switching signals outputted from a preceding one of the delay units.

A third aspect of the present invention relates to an active matrix display, comprising an active matrix portion comprising a plurality of active matrix units arranged in columns and rows; a first switch portion comprising a plurality of first switches which are switched on in response to respective first switching signals to allow first signals to be outputted to the active matrix units; and a first switching signal generator sequentially asserting the first switching signals in response to a source switching signal, thereby switching on the first switches and allowing the first signals to be outputted to the active matrix units in sequence.

Preferably, the first switching signal generator comprises a plurality of delay units interconnected in series for asserting the first switching signals in sequence.

Preferably, the active matrix display further comprises a second switch portion comprising a plurality of second switches which are switched on in response to respective second switching signals to allow second signals to be outputted to the active matrix units; and a second switching signal generator sequentially asserting the second switching signals in response to the source switching signal, thereby switching on the second switches and allowing the second signals to be outputted to the active matrix units in sequence.

Preferably, the second switching signal generator comprises a plurality of delay units interconnected in series for asserting the second switching signals in sequence.

In an embodiment, the first signals are outputted to the active matrix units via data lines, and the second signals are outputted to the active matrix units via scan lines.

If the first signals are digital video signals, the active matrix display preferably further comprises a plurality of digital-to-analog converters electrically connected between the first switches and the active matrix units for converting the digital video signals passing through the first switches into analog video signals.

BRIEF DESCRIPTION OF THE DRAWINGS

The present invention may best be understood through the following description with reference to the accompanying drawings, in which:

FIG. 1(*b*) is a schematic circuit diagram showing a display cell of the liquid crystal display of FIG. 1(*a*);

FIG. 1(*c*) is a schematic circuit diagram showing a shift register in FIG. 1(*a*);

DETAILED DESCRIPTION OF THE INVENTION

Figure 1A:
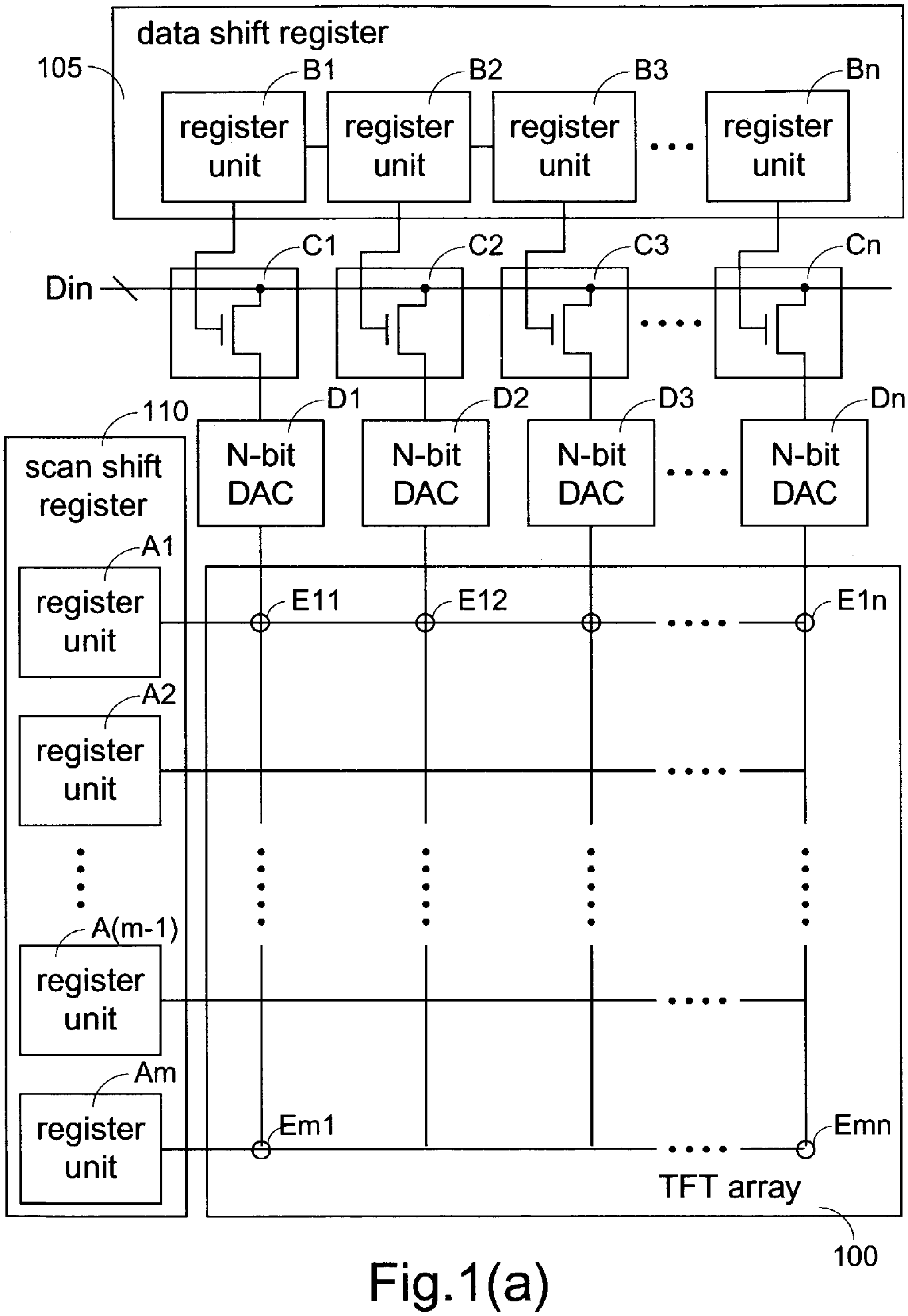
Fig.1(a) PRIOR ART
FIG. 1(*a*) is a circuit block diagram schematically showing a prior art liquid crystal display.
Figure 1B:
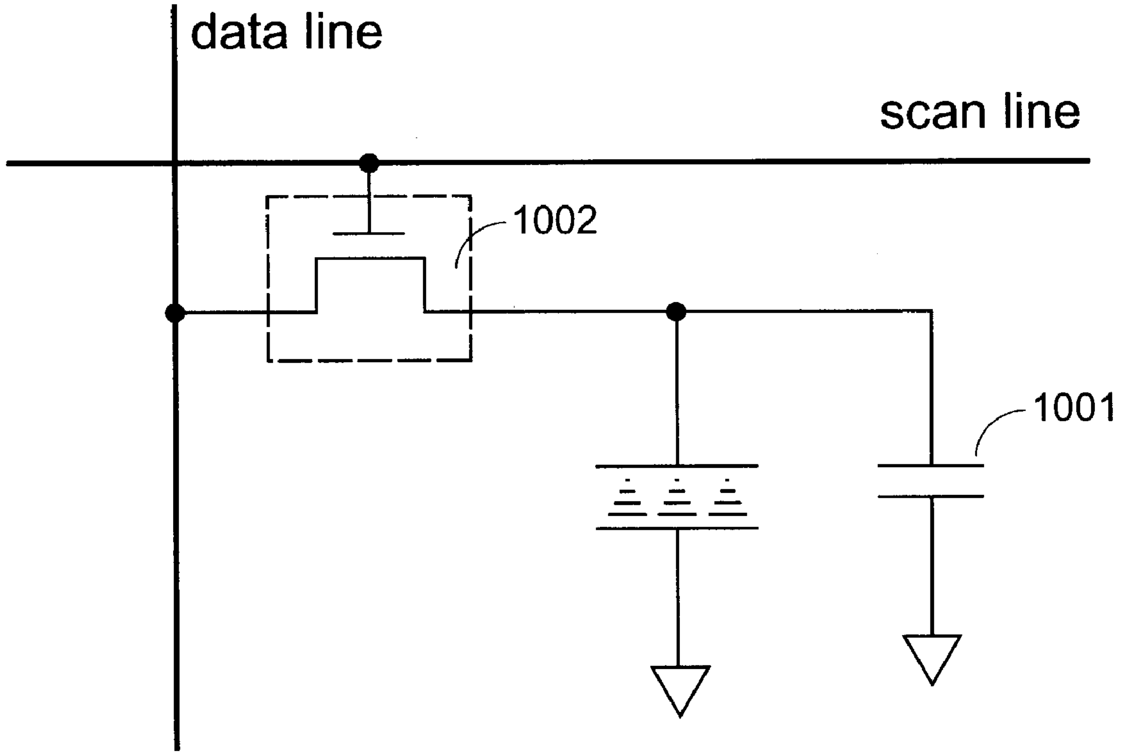
Fig.1(b) PRIOR ART
Figure 1C:
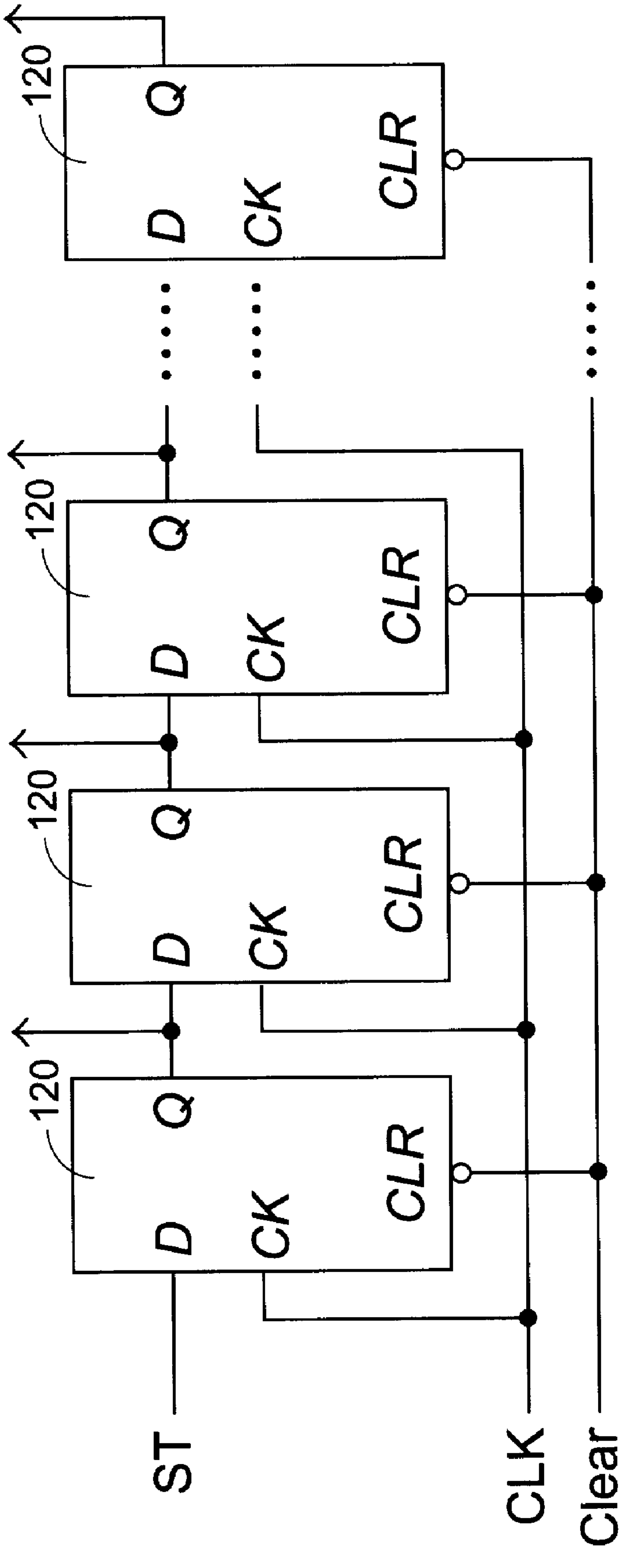
Fig.1(c) PRIOR ART
Figure 2:
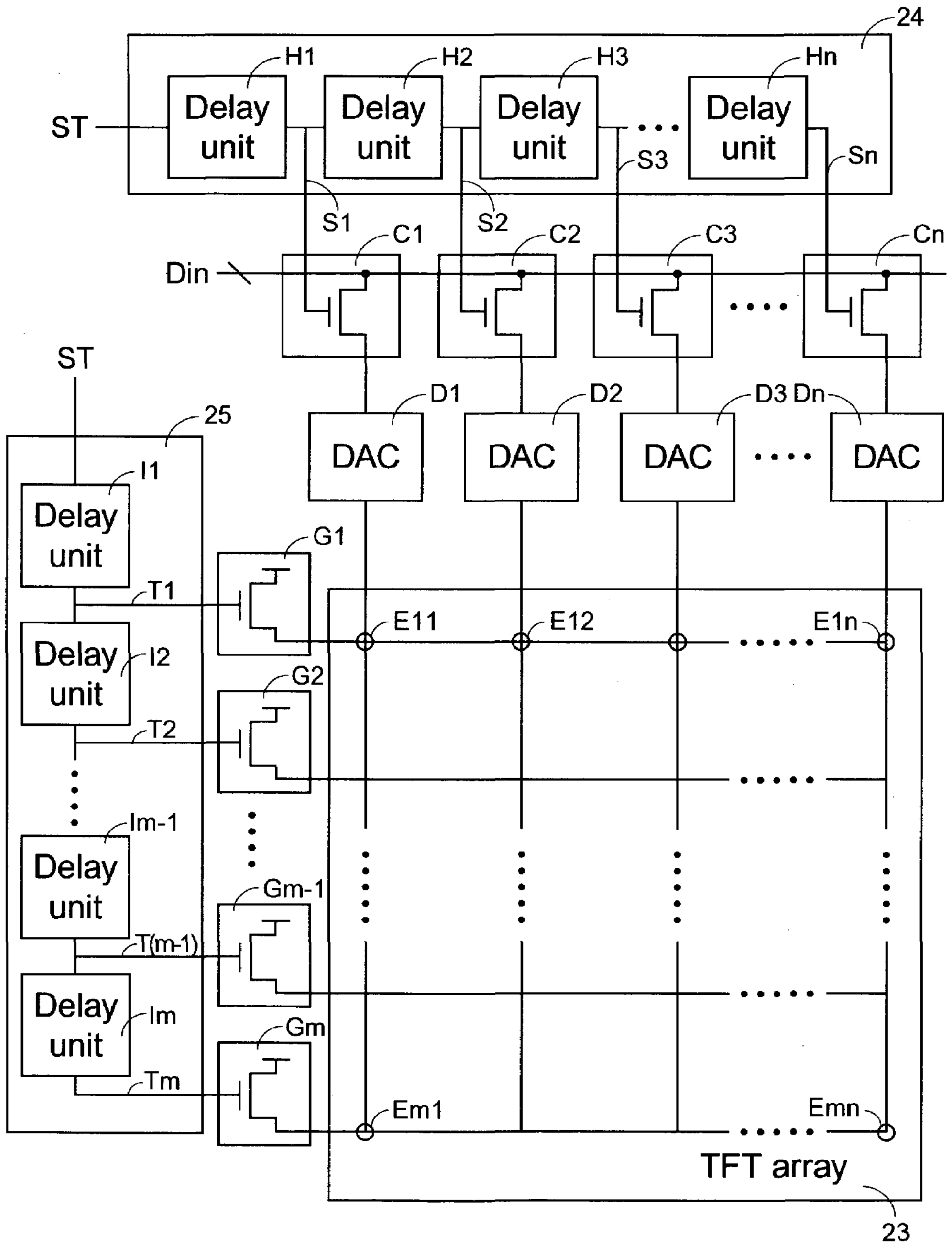
FIG. 2 is a circuit block diagram schematically showing a preferred embodiment of an active matrix display according to the present invention.

Please refer to FIG. 2 which is a circuit block diagram schematically showing a preferred embodiment of an active matrix display according to the present invention. The active matrix display includes an N-bit data line (Din), data switches C1~Cn, scan switches G1~Gm, N-bit digital-to-analog converters D1~Dn, a thin film transistor array 23 consisting of a plurality of display cells E11~Emn, a first switching signal generator 24, and a second switching signal generator 25.

The first switching signal generator 24 includes at least one delay device. The delay device consists of n delay units H1~Hn interconnected in series. The delay units H1~H*n* are connected to respective data switches C1~Cn. Responsive to receiving a source switching signal (ST), the delay units H1~H*n* provide the data switches C1~Cn with corresponding target switching signals S1~Sn. There is a constant phase shift between every two successive target switching signals. Therefore, the data switches C1~Cn are turned on in turn. That is, the digital video signals in the N-bit data line (Din) pass through corresponding data switch C1~Cn in sequence.

The data switches C1~Cn, connected to the delay units H1~Hn, N-bit data line (Din), and N-bit digital-to-analog converters D1~Dn, receive the digital video signals from the data line (Din) and transmit the digital video signals to corresponding N-bit digital-to-analog converters D1~Dn in response to corresponding target switching signals. The N-bit digital-to-analog converters then convert the received digital video signals into analog video signals which will be provided for the corresponding data line.

In FIG. 2, each data switch C1~Cn is represented by one transistor for simplicity. In fact, each data switch C1~Cn preferably includes more than one transistors.

In the same manner, the second switching signal generator 25 includes at least one delay device. The delay device consists of m delay units I1~Im interconnected in series. The delay units I1~Im are connected to respective scan switches G1~Gm. Responsive to receiving a source switching signal (ST), the delay units I1~Im provide the scan switches G1~Gm with corresponding target switching signals T1~Tm. There is a constant phase shift between every two successive target switching signals. Therefore, the scan switches G1~Gm are switched on one by one at an interval. The scan lines are driven in turn to switch on the thin film transistors of display cells in the associated row.

In FIG. 2, each scan switch G1~Gm is represented by one transistor for simplicity. In fact, each scan switch G1~Gm preferably includes more than one transistors.

Figure 3A:
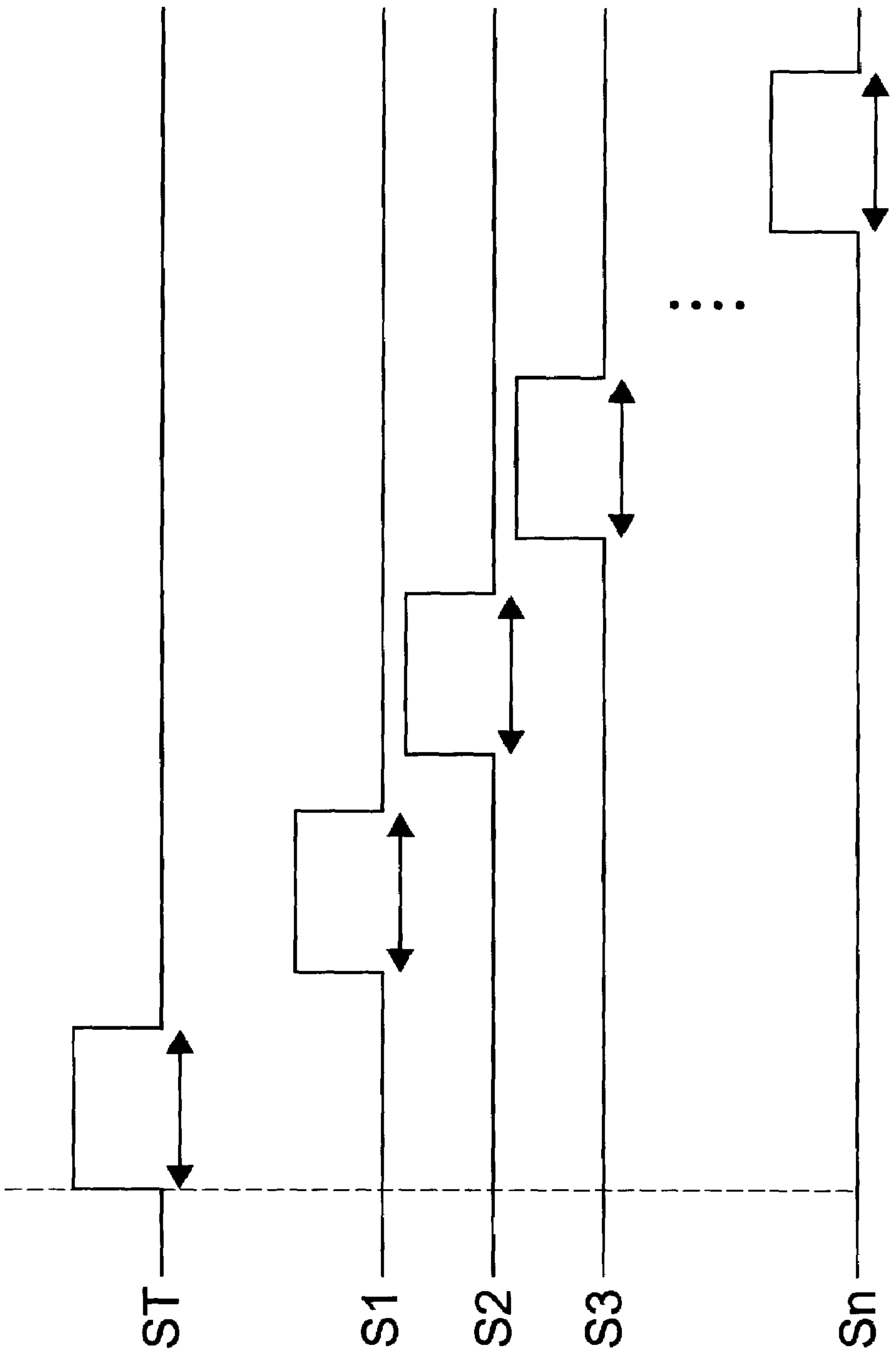
FIGS. 3(*a*) and 3(*b*) are waveform diagrams showing the phase relations among a source switching signal and target switching signals generated by the first and second, respectively, according to the present invention.
Figure 3B:
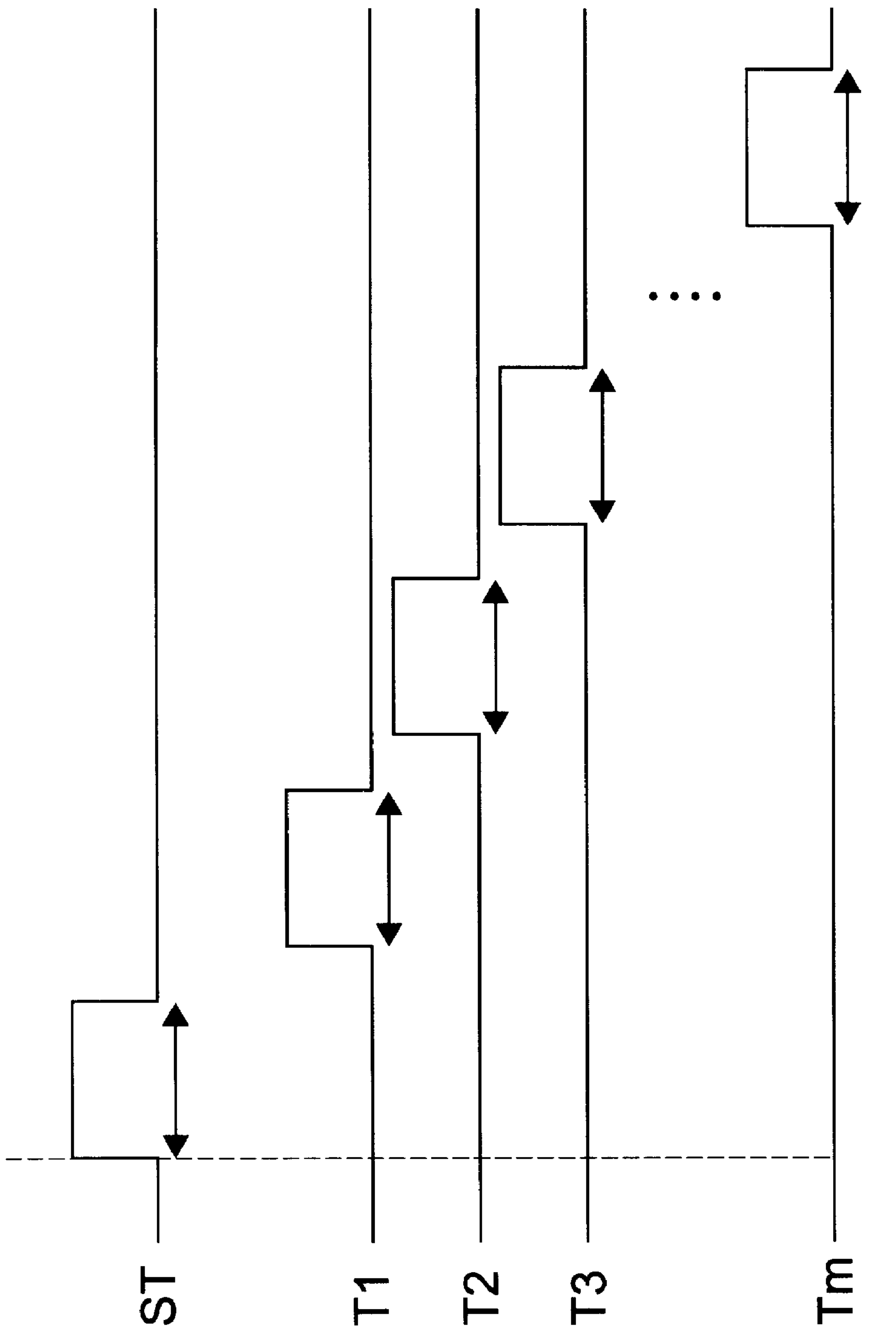

Please refer to FIGS. 3(*a*) and 3(*b*) showing the phase relations among the switching signals. Upon receiving the source switching signal ST, the first delay unit H1 generates a first target switching signal S1 having a phase shift from the source switching signal. In response to the switching signal S1, the first data switch C1 is switched on so that the first group of digital video signals from the N-bit data line (Din) passes through the first data switch C1 to be converted into the first group of analog video signals by the N-bit digital-to-analog converter D1. The first group of analog video signals then get into the first data line of the thin film transistor array 23, which controls the display cells E11~Em1. At the same time, the first delay unit I1 of the second switching signal generator 25 switches on the first scan switch G1 in response to the switching signal T1 to drive the first scan line of the thin film transistor array 23, which controls the display cells E11~E1*n*. Hence, the first group analog video signals are stored in the display cell E11 corresponding to the first scan line and the first data line.

The delay unit H2 receives the first target switching signal S1 and generates a second target switching S2 having a phase shift later than the first target switching signal S1. Therefore, the second data switch C2, following the first data switch C1, is switched on. Hence, the second group of digital video signals from the N-bit data line (Din) passes through the second data switch C2, and then are converted into the second group of analog video signals by the N-bit digital-to-analog converter D2. Next, the second group of analog video signals get into the second data line connecting the display cells E12~Em2. At the same time, it is still the first scan line connecting the display cells E11~E1*n* is driven. Hence, the second group analog video signals are stored in the display cell E12 corresponding to the first scan line and the second data line.

In the same manner, the switching signals S3~Sn from the other delay units H3~Hn switch on the data switches C3~Cn in sequence to have the display cells E13~E1*n* store corresponding groups of analog video signals. After the display cells E11~E1*n* in the first row are stored with the analog video signals, the second delay unit I2 of the second switching signal generator 25 provides the second scan switch G2 with a second target switching signal T2 to drive the second scan line connecting the display cells E21~E2*n*. The analog video signals are stored into the display cells E21~E2*n* in the second row of the thin film transistor array 23 by means as described above. After the second switching generator 25 completes driving all the scan lines, all the display cells E11~Emn of the thin film transistor array 23 store analog video signals. Hence, the liquid crystal display shows a full image page on screen.

In conclusion, the switching signal generators 24 and 25 are used to substitute for the prior art data shift register and scan shift register. According to the present invention, the same start pulse signal (source switching signal) is used to control the ON/OFF states of the scan switches for driving the scan lines and the same start pulse signal is used to control the ON/OFF states of the data switches for driving the data lines. Thus, the number of pins of the circuit chips is minimized. It also simplifies the circuitry of the liquid crystal display.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A switching signal generator for use with a plurality of switches of an active matrix display, comprising a series of delay units electrically connected to said plurality of switches, and functioning to generate a plurality of target switching signals having non-overlapping duty cycles in response to only one signal for switching on said plurality of switches to control signals to be outputted to an active matrix portion of said active matrix display via said plurality of switches, said only one signal being a source switching signal, wherein there is a constant phase shift between every two successive target switching signals, thereby switching on said plurality of switches and outputting said signals to said active matrix portion in sequence.

2. The switching signal generator according to claim 1 wherein said active matrix portion includes a thin film transistor (TFT) array interconnected by a plurality of scan lines and data lines.

3. The switching signal generator according to claim 1 wherein the first one of said delay units receives said source switching signal, and each of the following delay units receives one of said target switching signals outputted from a preceding one of said delay units.

4. The switching signal generator according to claim 1 wherein said switching signal generator generates said plurality of target switching signals in response to said source switching signal for controlling signals to be sequentially outputted to data lines of said active matrix display via said plurality of switches.

5. The switching signal generator according to claim 4 wherein said signals outputted via said plurality of switches are digital video signals, which are converted into analog video signals by a plurality of digital-to-analog converters of said active matrix display before being outputted to said data lines.

6. The switching signal generator according to claim 1 wherein said switching signal generator generates said plurality of target switching signals in response to said source switching signal for controlling signals to be sequentially outputted to scan lines of said active matrix display via said plurality of switches.

7. A switching signal generator for use in an active matrix display, comprising a first switching signal generator receiving only one signal and functioning to generate a set of first non-overlapping target switching signals for switching on a plurality of first switches, and a second switching signal generator receiving only one signal and functioning to generate a set of second non-overlapping target switching signals for switching on a plurality of second switches, said only one signal received by said first switching signal generator and said second switching signal generator being a first source switching signal and a second source switching signal, respectively, wherein there is a first phase shift between every two of said first target switching signals and there is a second phase shift between every two of said second target switching signals for switching on active matrix units of said active matrix display in sequence.

8. The switching signal generator according to claim 7 wherein said first switching signal generator comprises a plurality of delay units, the first one of said delay units receives and delays said source switching signal, and each of the following delay units receives and delays one of said target switching signals outputted from a preceding one of said delay units.

9. The switching signal generator according to claim 7 wherein said active matrix units of said active matrix display comprise a thin film transistor away interconnected by scan lines and data lines.

10. An active matrix display comprising:

an active matrix portion comprising a plurality of active matrix units arranged in columns and rows;

a first switch portion comprising a plurality of first switches which are switched on in response to respective first target switching signals to allow first signals to be outputted to said active matrix units; and a first switching signal generator sequentially asserting said first target switching signals in response to only one signal which is a first source switching signal, thereby switching on said first switches and allowing said first signals to be outputted to said active matrix units in sequence.

11. The active matrix display according to claim 10 further comprising:

a second switch portion comprising a plurality of second switches which are switched on in response to respective second target switching signals to allow second signals to be outputted to said active matrix units; and a second switching signal generator sequentially asserting said second target switching signals in response to only one signal which is a second source switching signal, thereby switching on said second switches and allowing said second signals to be outputted to said active matrix units in sequence.

12. The active matrix display according to claim 11 wherein said second switching signal generator comprises a plurality of delay units interconnected in series for asserting said second target switching signals in sequence.

13. The active matrix display according to claim 11 wherein said first signals are outputted to said active matrix units via data lines, and said second signals are outputted to said active matrix units via scan lines.

14. The active matrix display according to claim 10 wherein said first signals are digital video signals, and said active matrix display further comprises a plurality of digital-to-analog converters electrically connected between said first switches and said active matrix units for converting said digital video signals passing through said first switches into analog video signals.

15. The active matrix display according to claim 10 wherein said first switching signal generator comprises a plurality of delay units interconnected in series for asserting said first target switching signals in sequence.

* * * * *